United States Patent
Mun et al.

(10) Patent No.: US 7,262,493 B2
(45) Date of Patent: Aug. 28, 2007

(54) SYSTEM AND METHOD FOR MOUNTING ELECTRICAL DEVICES

(75) Inventors: Lee Sai Mun, Penang (MY); Gurbir Singh, Penang (MY); Seow Piang Joon, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/030,022

(22) Filed: Jan. 6, 2005

(65) Prior Publication Data

US 2006/0145178 A1     Jul. 6, 2006

(51) Int. Cl.
*H01L 23/02* (2006.01)
*H01L 23/48* (2006.01)

(52) U.S. Cl. .................... 257/678; 257/690; 257/691; 257/698; 257/734; 257/E23.001; 257/E23.194; 257/E21.499

(58) Field of Classification Search ........ 257/678–680, 257/690–691, 693, 698, 723, 730–734, 787, 257/E23.001, E23.194, E21.499
See application file for complete search history.

(56) References Cited

U.S. PATENT DOCUMENTS

| | | | |
|---|---|---|---|
| 5,852,320 A * | 12/1998 | Ichihashi .................... 257/419 |
| 6,037,655 A * | 3/2000 | Philbrick et al. ........... 257/680 |
| 6,593,663 B2 * | 7/2003 | Ikezawa et al. ............. 257/777 |
| 6,768,196 B2 * | 7/2004 | Harney et al. .............. 257/729 |
| 6,798,031 B2 * | 9/2004 | Honda et al. ............... 257/433 |
| 6,864,554 B2 * | 3/2005 | Lin et al. .................... 257/434 |
| 6,946,714 B2 * | 9/2005 | Waitl et al. .................... 257/99 |

FOREIGN PATENT DOCUMENTS

JP      53-80988     *   7/1978  ................... 257/99

* cited by examiner

*Primary Examiner*—Jasmine Clark

(57) ABSTRACT

In one embodiment an electronic device, such as an optical sensor, is attached to a substrate upon which wire logouts and, if desired, other components are constructed. A frame, or cover, is attached to the substrate surrounding the attached device. An aperture in the cover allows wireless signals to pass in or out of the cover.

20 Claims, 5 Drawing Sheets

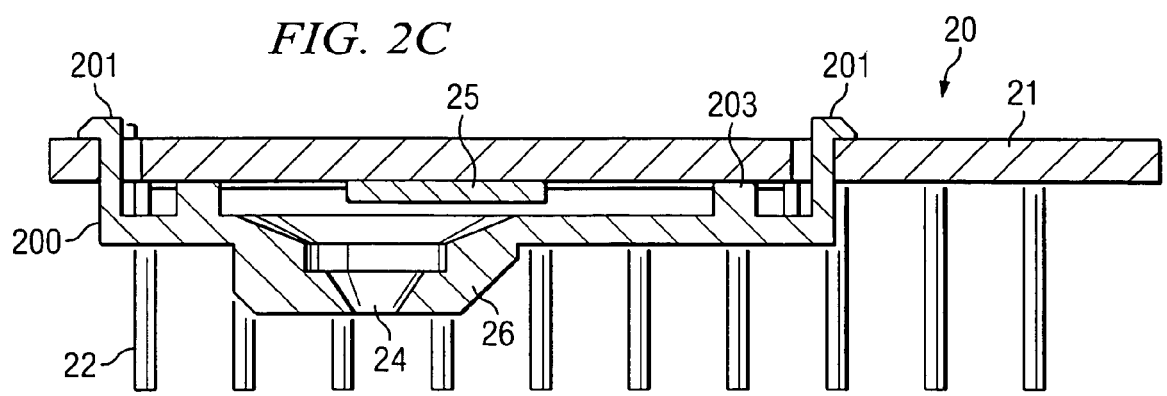
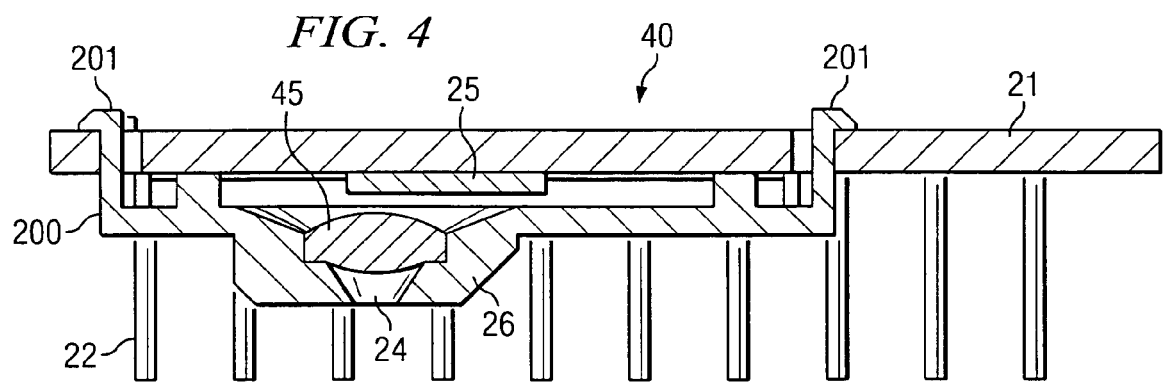
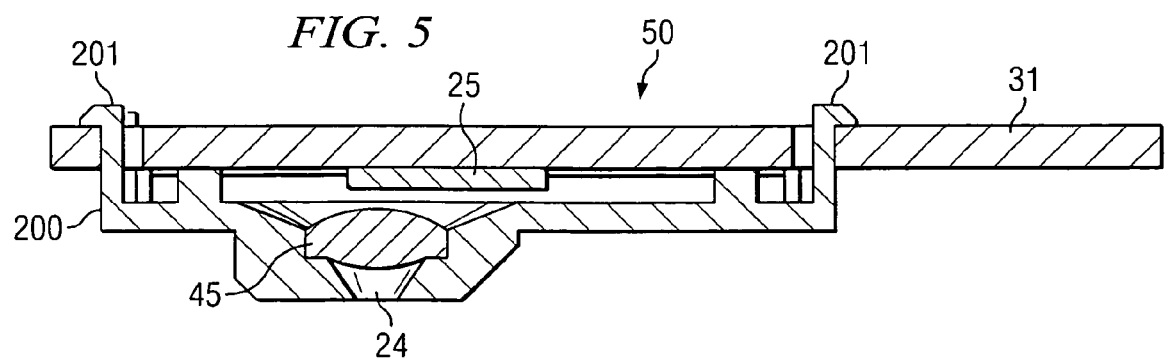

SYSTEM AND METHOD FOR MOUNTING ELECTRICAL DEVICES

TECHNICAL FIELD

This invention relates to mounting of electrical devices.

BACKGROUND OF THE INVENTION

Currently, optical navigation devices are constructed using an insert-molded lead frame based package. The insert-molded package is constructed by molding a plastic package over a metal-based lead frame. An optical sensor (or die) is attached to the lead frame inside the plastic package. An electronic component, such as wire bonds, provide the electrical connections from the die to the leads (pins) of the lead frame, and hence to the outside world. This construction is relatively expensive and requires a metal stamping tool as well as a molding tool to achieve the finished product. In addition, the spacing between traces (the metal runs on the lead frame) is controlled by lead frame stamping capabilities.

BRIEF SUMMARY OF THE INVENTION

In one embodiment an electronic device, such as an optical sensor, is attached to a substrate upon which wire logouts and, if desired, other components are constructed. A frame, or cover, is attached to the substrate surrounding the attached device. An aperture in the cover allows wireless signals to pass in or out of the cover.

BRIEF DESCRIPTION OF THE DRAWINGS

FIG. 2C shows a sectional view of the device of FIG. 2A;

FIGS. 4 and 5 show other alternative embodiments of sensors mounted on substrates.

DETAILED DESCRIPTION OF THE INVENTION

Figure 1A:
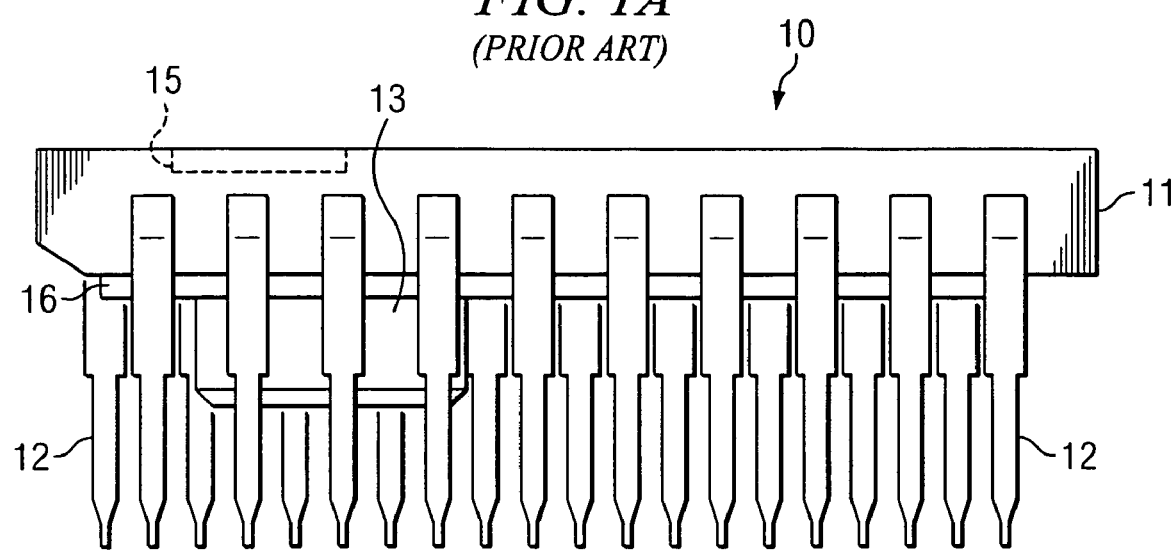
FIG. 1A shows one example of prior art of an optic sensor using insert-molded lead frame packaging.

FIG. 1A shows one example of prior art optical sensor device 10 using an insert-molded lead frame based package 16 having cover 11 thereon. The insert-molded package is constructed by molding a plastic package over a metal based lead frame, such as one of the frames 16 shown in FIG. 1D. Sensor 15 is attached inside the molded package as shown in FIG. 1C. Wire bonds provide the electrical connections from sensor 15 to contacts 12 and hence to the outside world.

Figure 1B:
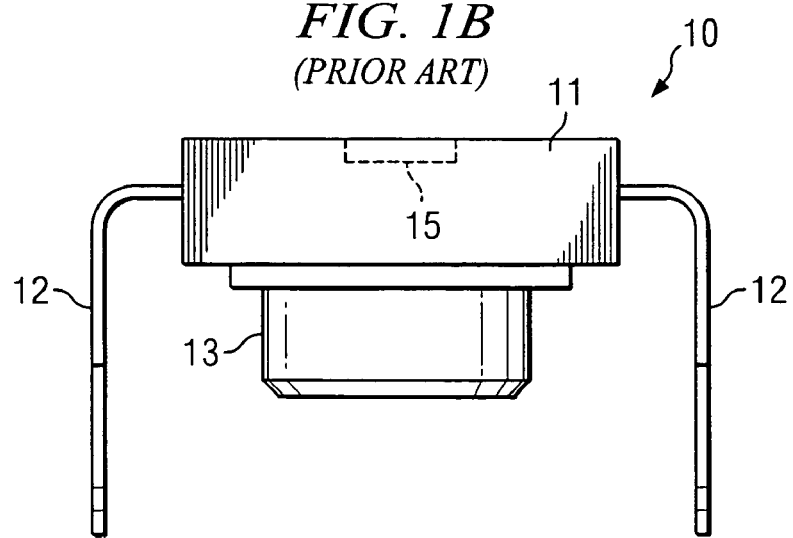
FIG. 1B shows a side view of the sensor of FIG. 1A.
Figure 1C:
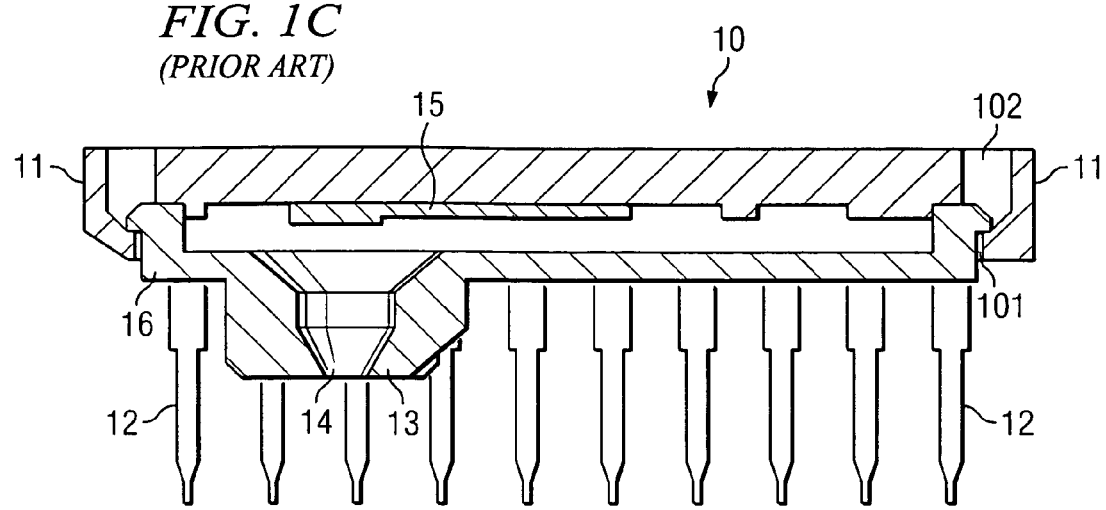
FIG. 1C shows a sectional view of the sensor of FIG. 1A.

FIG. 1B shows a side view of device 10. Such a device is inherently large and requires a stamping tool to cut the lead frame and a molding tool to form the package over the lead frame. A mechanical tool is also required to trim and bend or form the lead into the proper dimensions. The final product is not only labor intensive, but bulky.

FIG. 1C shows a sectional view of device 10 and illustrates how signals, such as light signals, pass through orifice 14 to impact on device 15. Cover 11 is fitted to protect device 10.

Figure 1D:
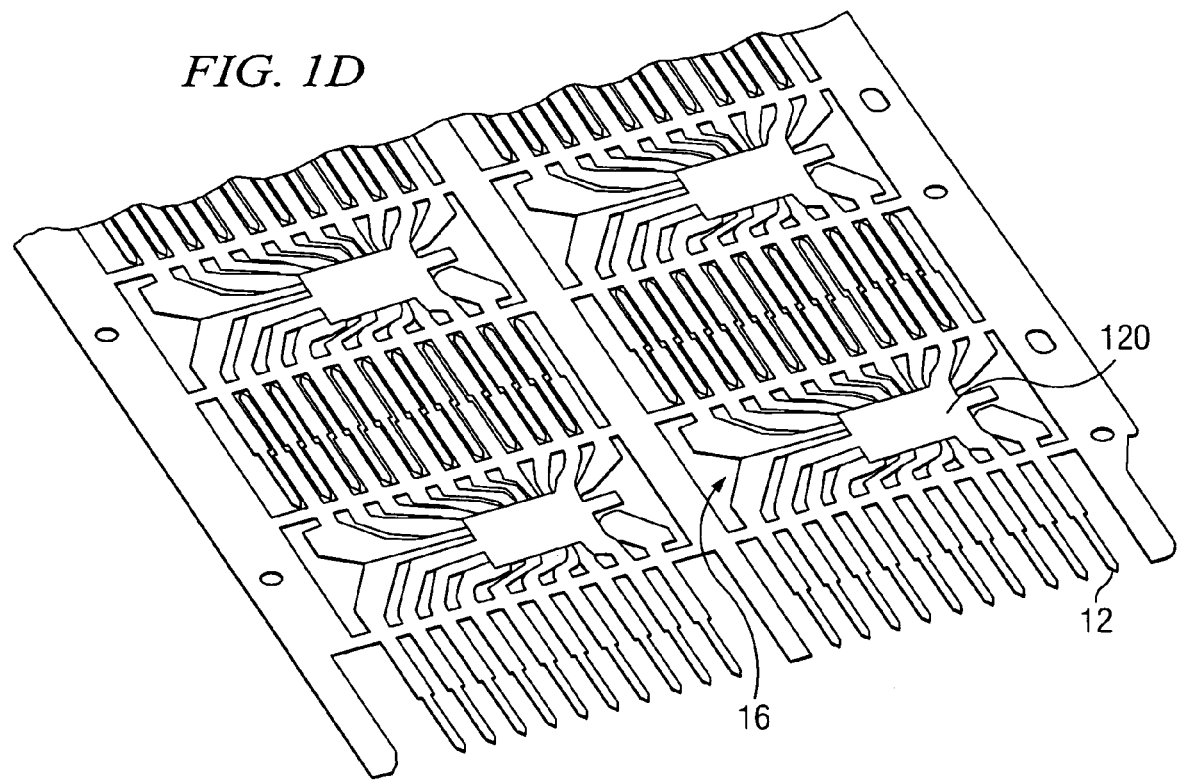
FIG. 1D shows one example of prior art unmolded lead frames.

FIG. 1D shows one embodiment of a number of lead frames in their bare (unmolded) slate. An optical device could be attached to pad 120.

Figure 2A:
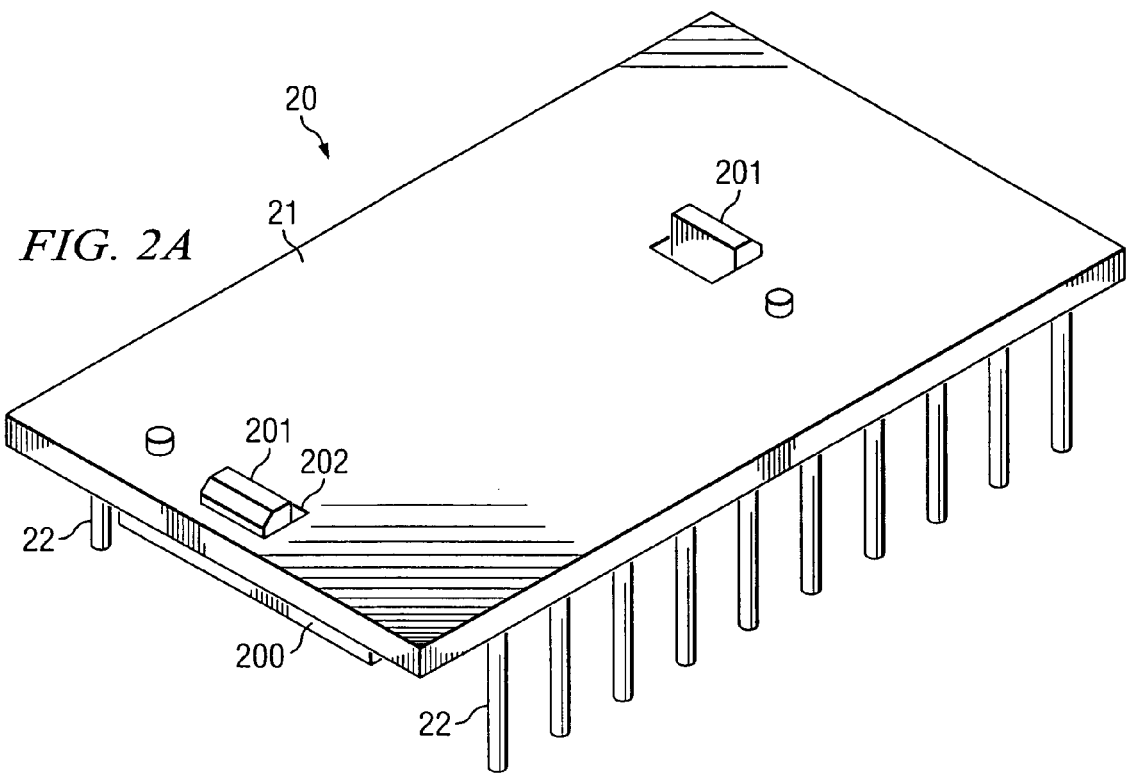
FIG. 2A shows one embodiment of an optical sensor mounted on a substrate.

FIG. 2A shows one embodiment of device 20 having an electronic device, such as optical sensor (or die) 25 (shown in FIG. 2C) mounted on substrate 21. Substrate 21 is formed and processed having suitable features for attaching the die wires (and other components, if desired) such that the sensor can be electrically connected to the other elements contained on the substrate and also connected to terminals 22 which connect the substrate of the outside world. Sensor 15 can operate in the visual spectrum or in any spetrum.

Figure 2B:
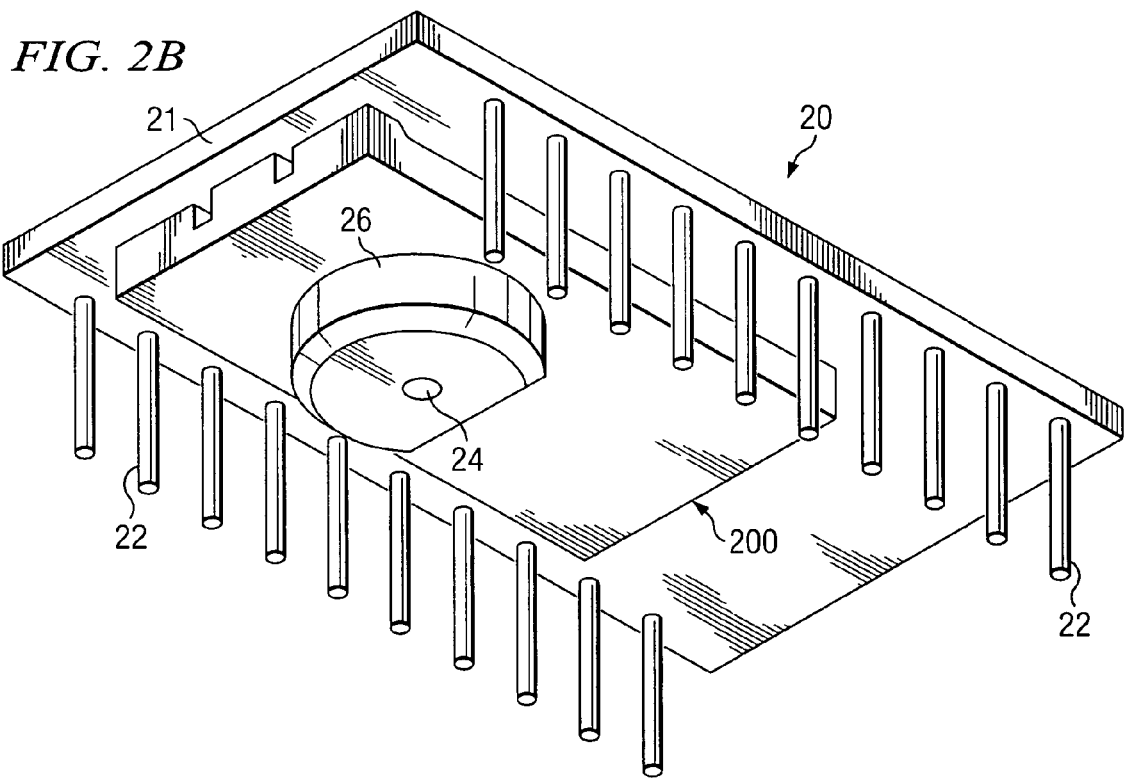
FIG. 2B shows a bottom view of the device of FIG. 2A.

FIG. 2B shows a bottom view of device 20 where housing 200 covers optical sensor 25. Aperture 24 is formed in dome 26 so as to allow wireless signals, such as light, to enter or exit housing 200.

FIG. 2C shows a sectional view of device 20 of FIG. 2A showing sensor 25 contained within housing 200. Housing 200 is attached to substrate 21 via openings 202 (shown in FIG. 2A) with tabs 201 of housing 200 being pushed through the openings in a one-way direction. Housing 200 could contain stiffening braces 203, if desired, to provide rigidity of the housing with respect to substrate 21. Wire bonding can be utilized to electrically connect sensor 25 to respective traces on substrate 21. Note that sensor 25 could be a sensor for receiving wireless signals from outside device 20, or could be a transmitter for sending such signals, or could be both. The signals are communicated, either inbound or outbound, via aperture 24. In one embodiment, the signals are optic signals and aperture 24 is transparent to such optic signals while blocking unwanted signals or wavelengths. While not shown, a cover could be positioned with respect to aperture 24 to keep out unwanted material or signals, but still be transparent to the desired signals.

Electrically conductive pins 22 may be attached prior to or after attaching the sensor and/or wire bonds and the pins may extend from the same side of the substrate as the sensor, or from the reverse side, or from both sides. Sensor 25 and housing 200 in this embodiment are fitted so as to fall between parallel rows of terminals. Housing 200 is attached after sensor 25 is added to protect the sensor and wire bonds. Housing 200 contains suitably sized and shaped opening 24 which acts as an optical aperture. Note that sensor 15 is not limited to an optic sensor but rather can be any device positioned such so as to receive or transmit signals via an aperture. While the aperture shown in this embodiment is in-line with the sensor it could be off-set therefrom if desired.

Housing 200 can be attached to substrate 21 by chemical bonding, adhesive, welding, heat sealing, or a combination thereof. In addition, if desired, housing 200 can be sealed using an opaque sealing agent to limit stray light and/or particles from leaking into the package at the interface with the substrate. The total height of the device, including housing 200, is less than the normal height of terminals 22, which is approximately 4.2 mm. However, any size will work.

Figure 3A:
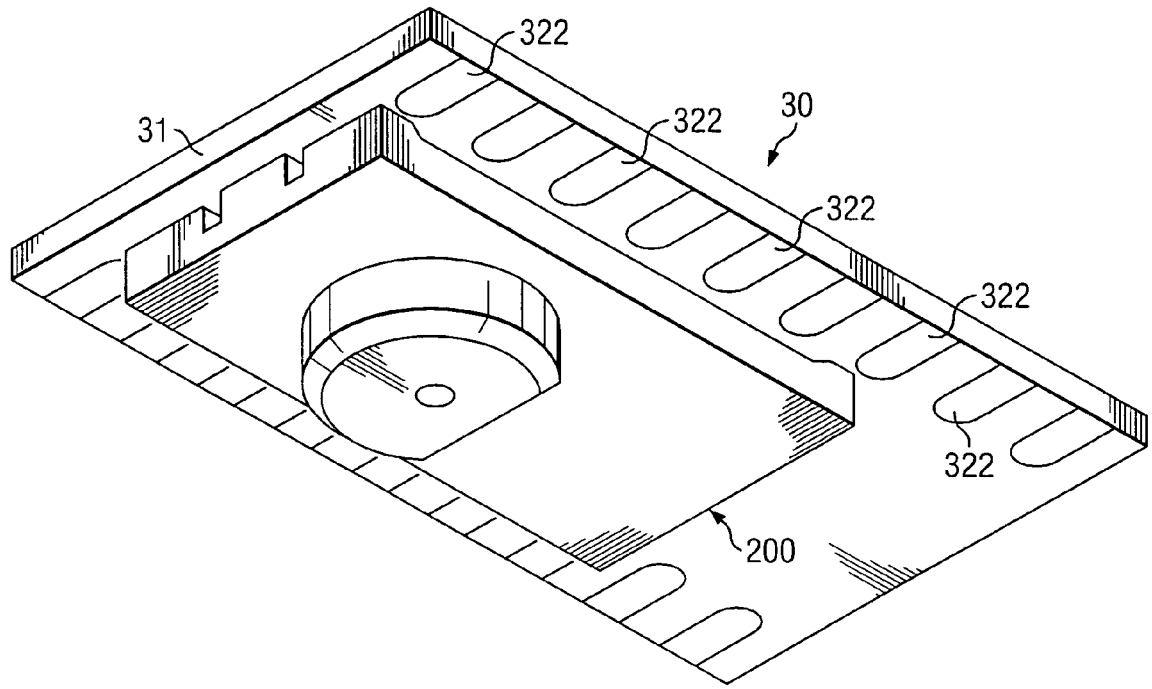
FIGS. 3A and 3B show alternative embodiments of an optical sensor mounted on a substrate.

FIG. 3A shows one alternative device 30 having housing 200 (with a sensor inside) mounted on substrate 31 upon which flat (planar) terminals 32L are positioned.

Figure 3B:
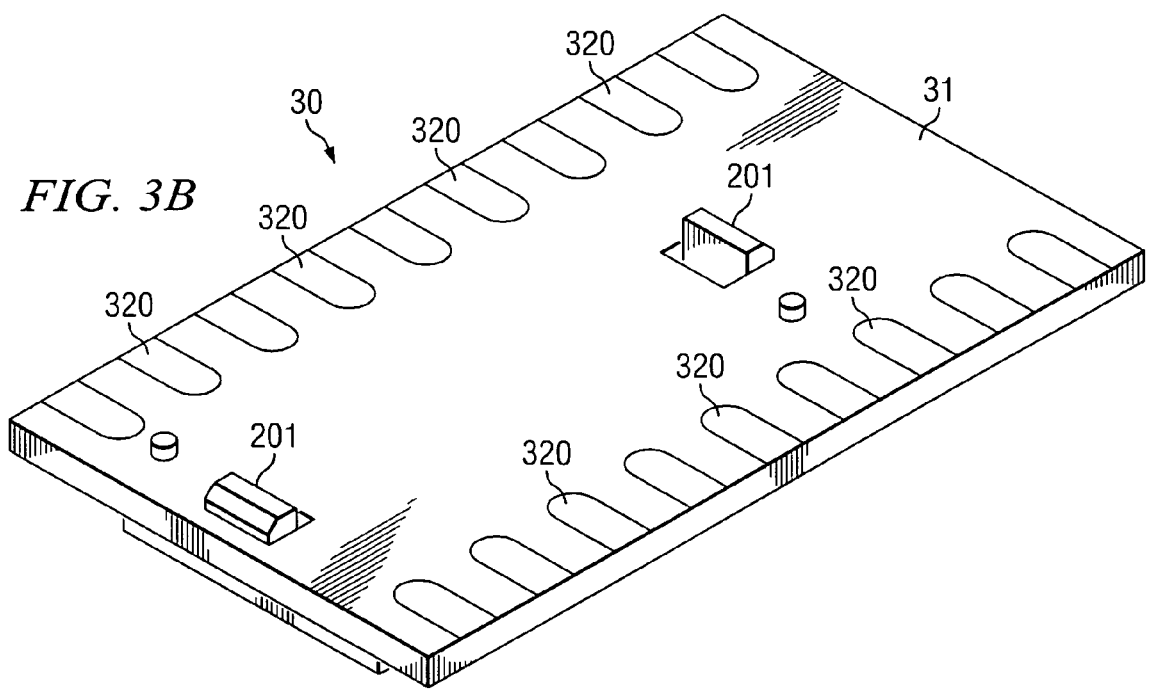

FIG. 3B shows a top view of device 30 with flat (planar) terminals 32U showing that the terminals that connect to the outside world can be on the bottom (32L), or top (32U), or on both surfaces as desired. Housing 200 is snapped into substrate 31 using tabs 201 through holes 202 in substrate 31.

FIG. 4 shows an alternative embodiment where device 40 has optics, such as lens 45, positioned in housing 200. Optics 45 can be active or passive and serves to modify or direct wireless signals passing there through. The optics could be a filter to block certain signals and, if desired, could be used to block dust and other particles from entering housing 200, as well as to pass the desired signals.

FIG. 5 shows another embodiment 50 where instead of having perpendicular terminals 22, substrate 31 has planar contacts as shown in FIGS. 3A and 3B. Note that while housing 200 is shown being mechanically attached to the substrate by a latch mechanism it could also be attached, as discussed above, using chemical bonding, adhesive, welding, heat staking or a combination thereof.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A device comprising:
   a substrate;
   a sensor coupled to said substrate, said sensor configured to send and/or receive wireless signals;
   a housing comprising an aperture, said aperture positioned within said housing to allow wireless signals to pass from one side of said housing to the other side of said housing; and
   at least one mechanical fastener coupling said housing to said substrate wherein said housing is coupled to said substrate such that said housing and said substrate form an enclosure around said sensor such that said sensor is completely enclosed except for said aperture.

2. The device of claim 1 wherein said at least one mechanical fastener is selected from the list of: one-way snap latches, rivets, and screws.

3. The device of claim 1 wherein, when said housing is coupled to said substrate said device has a form factor less than 4.2 mm.

4. The device of claim 1 wherein:
   said sensor is an optical sensor and said aperture is configured to allow optical signals to enter and exit.

5. The device of claim 2 wherein:
   said sensor is an optical sensor and said aperture is configured to allow optical signals to enter and exit.

6. The device of claim 5 wherein: said aperture comprises optics.

7. A housing for connection to a substrate, said substrate coupled to a sensor, said housing comprising:
   a first wall, said first wall positioned to be parallel to the surface of said substrate when said housing is coupled to said substrate;
   at least one side wall extending from said first wall positioned to be between said first wall and said substrate when said housing is coupled to said substrate;
   means for coupling said substrate to said at least one side wall, said means comprising one or more of: one-way snap latches, glue, chemical bonding, heat bonding, rivets, welding, screws; and
   an aperture positioned in said first wall;
   wherein said housing and said substrate form an enclosure around said sensor such that said sensor is completely enclosed except for said aperture.

8. The housing of claim 7 wherein said means for coupling said substrate to said at least one side wall comprises a plurality of one-way snap latches configured to extend into openings in said substrate.

9. The housing of claim 7 wherein said aperture comprises optics.

10. The housing of claim 8 wherein said aperture comprises optics.

11. The housing of claim 7 wherein said aperture is formed in a dome positioned in said first wall.

12. The housing of claim 7 further comprising a plurality of stiffening braces.

13. The housing of claim 7 wherein when said housing is coupled to said substrate, said aperture is in-line with said sensor.

14. The housing of claim 7 wherein when said housing is coupled to said substrate, said aperture is offset from said sensor.

15. A package for enclosing an electronic sensor capable of sending and/or receiving a type of wireless signals comprising:
   a first surface coupled physically and electrically to said electronic sensor, said first surface opaque to said type of wireless signals;
   a second surface, said second surface comprising a first portion positioned to be parallel to said first surface when said second surface is connected to said first surface, and a second portion extending from said first portion positioned to be between said first portion and said first surface when said second surface is connected to said first surface, said second surface opaque to said type of wireless signals;
   wherein said first portion comprises an aperture, said aperture not opaque to said type of wireless signals, said aperture not including the entire first portion; and
   means for connecting said first surface to said second surface, said means not including molding connections.

16. The device of claim 15 wherein said means for connecting said first surface to said second surface comprises one or more of: one-way snap latches, glue, chemical bonding, heat bonding, rivets, welding, screws.

17. The device of claim 15 wherein said means for connecting said first surface to said second surface comprises a plurality of: one-way snap latches configured to extend into openings in said substrate.

18. The device of claim 17 wherein said type of wireless signals consists of optical signals.

19. The device of claim 18 wherein said aperture comprises optics.

20. The device of claim 15 wherein:
   said type of wireless signals consists of optical signals; and
   said aperture comprises optics.

* * * * *